(12) United States Patent
Cunningham

(10) Patent No.: US 6,271,464 B1
(45) Date of Patent: Aug. 7, 2001

(54) ELECTRONIC MAGNETIC INTERFERENCE AND RADIO FREQUENCY INTERFERENCE PROTECTION OF AIRBORNE MISSILE ELECTRONICS USING CONDUCTIVE PLASTICS

(75) Inventor: Robert J. Cunningham, Plano, TX (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 08/985,385

(22) Filed: Dec. 4, 1997

Related U.S. Application Data

(60) Provisional application No. 60/033,116, filed on Dec. 18, 1996.

(51) Int. Cl.[7] .................................................. H05K 9/00
(52) U.S. Cl. ................... 174/35 R; 174/35 MS; 174/35 GC; 206/719; 361/816; 361/818; 244/3.14; 244/3.16; 244/3.19; 102/213; 102/214; 250/38.1
(58) Field of Search .......................... 174/35 R, 35 MS, 174/35 GC; 206/719; 361/816, 818; 244/3.14, 3.16, 3.19; 102/213, 214; 250/38.1

(56) References Cited

U.S. PATENT DOCUMENTS

| 4,227,037 | 10/1980 | Layton | 174/35 |
|---|---|---|---|
| 4,749,821 | 6/1988 | Linton et al. | 174/35 R |
| 5,219,132 | * 6/1993 | Beckerleg et al. | 244/3.16 |
| 5,262,630 | * 11/1993 | Kordulla | 250/203.6 |
| 5,404,814 | * 4/1995 | Fisch et al. | 102/293 |
| 5,455,587 | * 10/1995 | Schneider | 342/62 |
| 5,572,120 | 11/1996 | Takaishi et al. | 324/207.21 |
| 5,672,844 | 9/1997 | Persson et al. | 174/35 R |
| 5,847,938 | * 12/1998 | Gammon | 361/816 |

FOREIGN PATENT DOCUMENTS

| 2098455 A | * 6/1992 | (CA) . |
|---|---|---|
| 3633806A1 | 5/1988 | (DE) . |
| 4303399A1 | 8/1993 | (DE) . |
| 287805 | 3/1928 | (GB) . |

* cited by examiner

Primary Examiner—William A. Cuchlinski, Jr.
Assistant Examiner—Ronnie Mancho
(74) Attorney, Agent, or Firm—Baker Botts L.L.P.

(57) ABSTRACT

A detector assembly which includes an electrically conductive, two-piece, molded plastic housing including a relatively rigid bulkhead portion having a groove and a second dome portion having a sidewall extending over an adjacent bulkhead portion. The dome portion has a plurality of relatively flexible tabs, a part of each tab extending into the groove and making mechanical contact with the bulkhead portion via the groove to provide a press fit therebetween. An electrically conductive barrel is disposed within the housing and is electrically connected via an electrically conductive o-ring to the bulkhead to form an electrically shielded chamber within the housing in conjunction with the bulkhead and the dome portions. Equipment to be shielded is disposed within the chamber and is secured to the barrel.

12 Claims, 1 Drawing Sheet

ELECTRONIC MAGNETIC INTERFERENCE AND RADIO FREQUENCY INTERFERENCE PROTECTION OF AIRBORNE MISSILE ELECTRONICS USING CONDUCTIVE PLASTICS

CROSS REFERENCE TO RELATED APPLICATIONS

This application claims priority under 35 USC §119 of provisional application No. 06,033,116 filed Dec. 18, 1996.

This application is related to U.S. Ser. No. 08/982,554 filed Dec. 1, 1997 the contents of which are incorporated herein by reference.

BACKGROUND OF THE INVENTION

1. Field of the Invention

This invention relates to electrically conductive plastic housings, principally for optics, optical sensors, electronic printed wiring boards and, other systems and devices, the operation of which may be adversely affected by magnetic and/or radio frequency interference, for use in airborne detector systems and principally airborne missile guidance systems and the like.

2. Brief Description of the Prior Art

Guided airborne detector systems for dynamic airborne systems generally include, as a part of the airborne detector system, a detector guidance section for detecting target location and a control section for controlling airborne system trajectory in response to signals received from the detector guidance section in order to direct the airborne system to a selected target. Such detector and control systems must provide accurate and reliable outputs in order to insure that the desired trajectory is adhered to and that the ultimate target is reached. A problem with the detector and control electronics in such systems has been that magnetic and/or radio frequency interference emanating from the detector and/or the control section and/or other outside sources has been picked up by the airborne system electronics, thereby causing inaccurate readings to be provided, resulting in inaccurate trajectories with resultant failure to arrive at the desired target. For this reason, adequate shielding of the electrical components, cables and electrical interfaces between the detector, guidance and control sections of the airborne system has been critical to the accuracy and precision of the guidance which is required of the system.

In the prior art, this problem has been minimized by packaging and protecting electronic hardware and connections in the above described dynamic airborne systems using components fabricated from specially formed metallic housings, fastening hardware and interconnect components. The metallic forms were often expensive to produce, because their fabrication required close tolerances at joint and cable interface areas. Furthermore, if thin metallic components were damaged or joint areas were damaged prior to assembly, system protection against magnetic and/or radio frequency interference could be severely compromised. Though systems of the type described above have been used for many years and represent the prior state of the art, it is apparent that such systems have significant drawbacks including high cost and intricate assembly methods.

SUMMARY OF THE INVENTION

In accordance with the present invention, there is provided an assembly which minimizes the above noted problems of the prior art and which can be provided relatively inexpensively as compared with the above described prior art.

Briefly, there is provided an assembly including a two piece enclosure or housing of electrically conductive moldable plastic including a barrel portion and a bulkhead portion. Electrically conductive moldable plastic materials are well known and can be, for example, a moldable plastic material having electrically conductive fibers therein in sufficient quantity to provide electrical conductivity. The enclosure pieces lock together in an overlapping press fit by pushing the larger portion of the barrel into the bulkhead. The barrel contains a groove disposed adjacent the bulkhead portion which receives an electrically conductive o-ring to provide an electrically conductive path between the barrel and the bulkhead. This provides an electrically conductive shield for the electronic assembly which is disposed in the chamber formed by the bulkhead and the barrel.

The use of electrically conductive plastic parts, which cooperate to limit relative movement while providing adequate shielding, reduces part count, cost, weight and assembly time. The use of electrically conductive plastics also eliminates the need to machine to high tolerances metallic components, thereby reducing cost and the potential for defective parts. The assembly in accordance with the present invention shields the optical sensor and electrical components, and provides an adequate electrically conductive path for cable termination using the two piece electrically conductive plastic housing, the pieces of which is joined by an overlapped press fit. Cable termination is achieved using a simple threaded adapter which is fastened into the bulkhead portion, thereby creating an electrically conductive path between electrically conductive materials, such as, for example, electrically conductive fibers in the plastic and the metallic cable braid. Both the optical sensor and electrical components are mounted within the two piece housing during assembly.

DESCRIPTION OF THE PREFERRED EMBODIMENT

Figure 1:
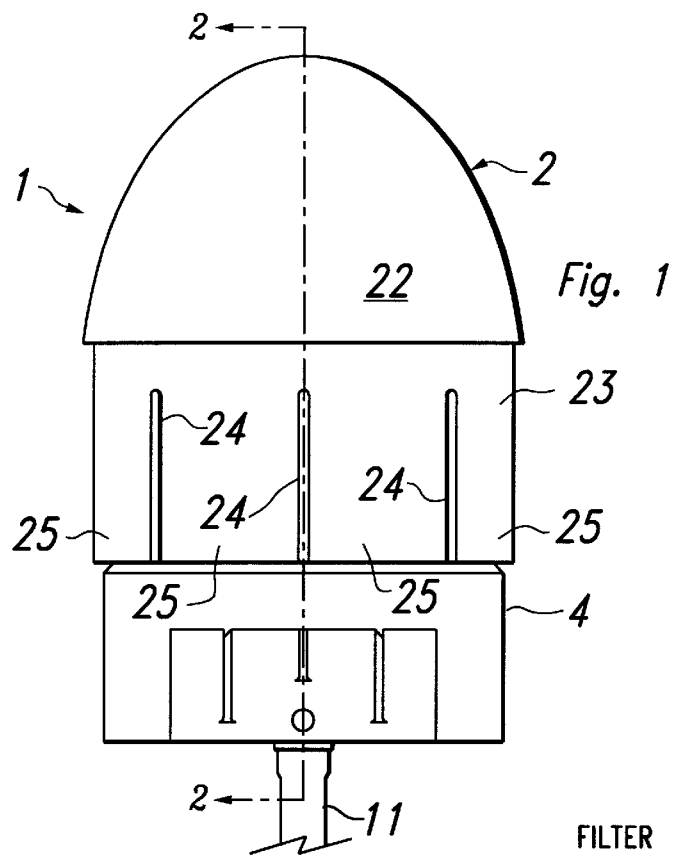
FIG. 1 is a side view of a detector assembly in accordance with the present invention.
Figure 2:
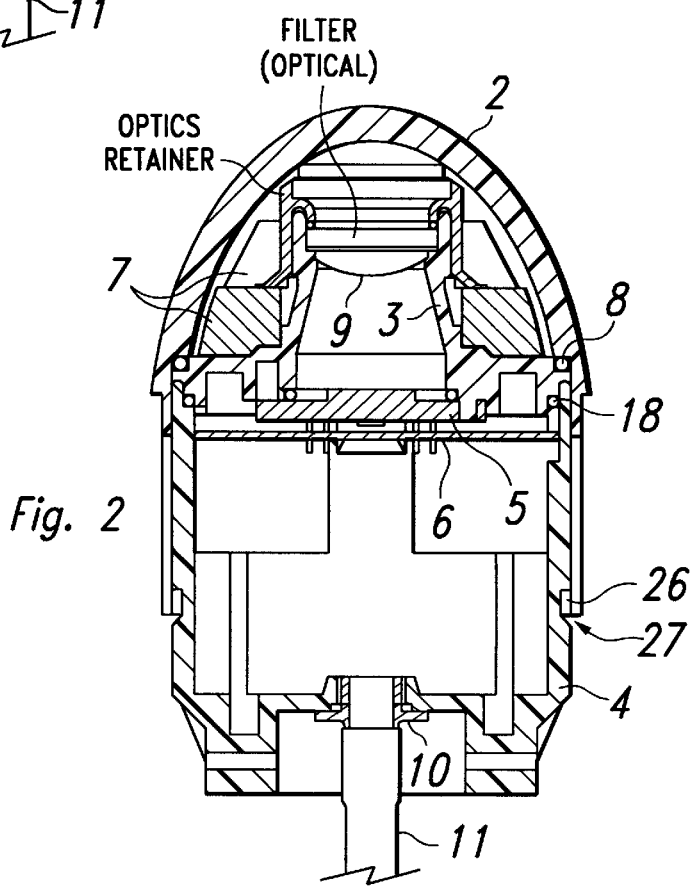
FIG. 2 is a cross-sectional view of the detector assembly of FIG. 1 taken along the line 2—2 of FIG. 1.

Referring to FIGS. 1 and 2, there is shown a side view of a detector assembly 1 in accordance with a preferred embodiment of the invention. The assembly is circular in cross-section through its axis. A barrel 3 formed of electrically conductive material, preferably the same type of material as the bulkhead 4, has an annular groove with an annular electrically conductive o-ring 18 within the groove, this groove being disposed adjacent to bulkhead 4 with the o-ring contacting the bulkhead 4. The combination of the barrel 3, the bulkhead 4 and o-ring 18 substantially form a chamber with an electrically conductive chamber wall except that there is no electrically conductive wall behind the lens 9. The chamber contains the electronics therein which is demonstrated by way of example by a detector chip 5 and a circuit board 6, both coupled to a portion of the barrel 3 within the chamber. Also shown is the metal adapter 10 threaded into the bulkhead 4, thereby creating an electrically conductive path between the metal cable braid 11 and electrically conductive chamber wall of the bulkhead 4. The combination of the bulkhead 4, metal adapter 10 and metal cable braid 11 creates an electrically conductive path for wiring, thereby protecting the chamber against outside sources of magnetic and/or radio frequency interference.

The dome portion 2 is made of an optically transmissive material. It includes an ellipsoid-shaped portion 22 of circular cross-section with continually increasing radius from the ellipsoid apex and then includes a following portion of circular cross-section with constant radius 23 extending to the edge of the ellipsoid-shaped portion. A plurality of spaced apart slits 24 extend around the portion 23 and extend in a direction parallel to the axis of the detector assembly 1. The slits 24 permit the tabs 25 formed by and between the slits to be flexible for engagement with the bulkhead portion 4 as will be explained hereinbelow to provide a press fit.

Referring to FIG. 2, it can be seen that the housing portion 23 of dome portion 2 is preferably thinner than the housing portion 22, thereby providing the flexibility to the portion 23 of the dome portion required for engagement with the bulkhead 4 while providing a rigid housing portion 22. The edge of the dome portion 23 includes an inwardly extending lip 26 which engages in a circular groove 27 disposed in the outer wall of the bulkhead 4 to provide a press fit between the dome portion 2 and the bulkhead 4. The fit is preferably sufficiently tight and the tabs 25 are sufficiently rigid to require a substantial force to pry the tabs out of the groove 27. A barrel 3 formed of electrically conductive material, preferably the same type of material as the bulkhead 4 has an annular groove with an annular electrically conductive o-ring 18 within the groove, this groove being disposed adjacent the bulkhead 4 with the o-ring contacting the bulkhead. An o-ring 8 to provide a seal between the dome 2 and the barrel 3 is disposed in a groove formed partly in the barrel and partly in the interior wall of the dome portion 22. The combination of the barrel 3 and the bulkhead 4 substantially forms a chamber with electrically conductive chamber walls behind the lens 9. The chamber contains the electronics therein which is demonstrated by way of example by a detector chip 5 and a circuit board 6, both coupled to a portion of the barrel 3 within the chamber. A desiccant 7 which is disposed within the housing and external to the chamber as well as the other standard optics required of the detector assembly are shown and not described since they form no part of the invention herein. Also shown is a cable assembly connection 10 and 11 extending out of the housing 1 with wiring therein which also forms no part of the invention and will not be further explained.

It can be seen that there has been provided a simple, low cost enclosure for use as a detector assembly, generally in high speed airborne equipment which is exposed to the environment, which provided the required shielding, yet can be easily assembled.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. An apparatus, comprising:
   a housing which includes first and second housing portions, and fastening structure operative to releasably couple said first and second housing portions together, said first and second housing portions defining a housing chamber within said housing when coupled by said fastening structure, and said second housing portion being made of an electrically conductive material;
   a member supported within said housing chamber so as to divide said housing chamber into a first chamber and a second chamber, said member being made of an electrically conductive material, and said second chamber being defined by said member and said second housing portion, said housing including structure facilitating an electrical coupling of said member to said second housing portion so that said second chamber is electrically shielded; and
   a circuit which is provided within said second chamber.

2. An apparatus according to claim 1, wherein said second housing portion has an aperture therein which communicates with said second chamber; and including a cable assembly having at one end thereof an electrically conductive adapter which is releasably engaged in said aperture and which is coupled to a conductive element in said cable.

3. An apparatus according to claim 1, wherein said structure facilitating an electrical coupling includes an electrically conductive element which engages each of said member and said second housing portion to provide an electrically conductive path therebetween.

4. An apparatus according to claim 3, wherein said electrically conductive element is an electrically conductive o-ring.

5. An apparatus according to claim 3, including a seal element which effects a seal between said member and said first housing portion.

6. An apparatus according to claim 5, wherein said first housing portion has an optically transparent portion which permits radiation to enter said first chamber, wherein said first chamber has therein an optics system which includes a detector responsive to radiation, and wherein said detector is operatively coupled to said circuit disposed in said second chamber.

7. An apparatus according to claim 6, wherein said detector and said circuit are supported on said member, and including a desiccant disposed in said first chamber.

8. An apparatus according to claim 1, wherein said first housing portion has an exterior portion which is dome-shaped.

9. An apparatus according to claim 1, wherein said fastening structure is a snap fastening arrangement integral to said first and second housing portions, and wherein said member has an edge portion which extends around a periphery thereof, said housing including structure cooperable with said edge portion of said member for maintaining said member in place when said first and second housing portions are releasably coupled by said fastening structure, and for permitting said member to be freely separable from said first and second housing portions when said first and second housing portions are physically separated from each other with said fastening structure disengaged.

10. An apparatus according to claim 1, wherein said first and second housing portions are each made of an electrically conductive plastic.

11. An apparatus according to claim 1, wherein said structure facilitating an electrical coupling includes a first groove disposed in at least one of said member and said second housing portion, and an electrically conductive o-ring disposed in said first groove and contacting said member and said second housing portion to provide an electrically conductive path between said member and said second housing portion.

12. An apparatus according to claim 11, further including a second groove disposed in at least one of said member and one of said first and second housing portions, and a second o-ring disposed in said second groove and contacting said member and said one of said first and second housing portions to provide a seal between said member and said one of said first and second housing portions.

* * * * *